(12) United States Patent
Kim (10) Patent No.: US 10,103,306 B2
(45) Date of Patent: Oct. 16, 2018

(54) LIGHT-EMITTING ELEMENT PACKAGE AND LIGHT-EMITTING ELEMENT MODULE COMPRISING SAME

(71) Applicant: LG INNOTEK CO., LTD., Seoul (KR)

(72) Inventor: Ki Hyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/740,714

(22) PCT Filed: May 20, 2016

(86) PCT No.: PCT/KR2016/005381
§ 371 (c)(1),
(2) Date: Dec. 28, 2017

(87) PCT Pub. No.: WO2017/003095
PCT Pub. Date: Jan. 5, 2017

(65) Prior Publication Data
US 2018/0190888 A1 Jul. 5, 2018

(30) Foreign Application Priority Data
Jul. 2, 2015 (KR) .................. 10-2015-0094497

(51) Int. Cl.
*H01L 27/15* (2006.01)
*H01L 29/26* (2006.01)
(Continued)

(52) U.S. Cl.
CPC .............. *H01L 33/62* (2013.01); *H01L 33/36* (2013.01); *H01L 33/54* (2013.01)

(58) Field of Classification Search
USPC ..... 257/13, 79–103, 918, E51.018–E51.022, 257/E33.001–E33.077, E25.028, E25.032;
(Continued)

(56) References Cited

U.S. PATENT DOCUMENTS 6,998,281 B2 2/2006 Taskar et al.
7,352,011 B2 4/2008 Smits et al.
(Continued)

FOREIGN PATENT DOCUMENTS

JP 2006-24615 * 1/2006
JP 2006-24615 A 1/2006
(Continued)

*Primary Examiner* — Tram H Nguyen
(74) *Attorney, Agent, or Firm* — Birch, Stewart, Kolach & Birch, LLP (57) ABSTRACT

Provided is a light-emitting element package, one embodiment comprising: a substrate; a light-emitting element disposed on the substrate; and a molded part surrounding the side surfaces and the top surface of the light-emitting element and having patterns on a surface from which the light incident thereto from the light-emitting element is output, wherein a part of the patterns correspond to a first area corresponding to the light-emitting element, and to a second area around the first area and are arranged at an angular range of 120 to 130 degrees on the surface of the molded part.

20 Claims, 9 Drawing Sheets

(51) Int. Cl.
    *H01L 31/12*     (2006.01)
    *H01L 33/00*     (2010.01)
    *H01L 33/62*     (2010.01)
    *H01L 33/36*     (2010.01)
    *H01L 33/54*     (2010.01)

(58) Field of Classification Search
    USPC .............. 438/22–47, 69, 493, 503, 507, 956
    See application file for complete search history.

(56) References Cited

U.S. PATENT DOCUMENTS

| | | | |
|---|---|---|---|
| 8,766,526 B2* | 7/2014 | Cho | G02B 6/0025 |
| | | | 313/152 |
| 9,859,464 B2* | 1/2018 | DeMille | H01L 33/06 |
| 2007/0012940 A1* | 1/2007 | Suh | H01L 33/507 |
| | | | 257/99 |
| 2008/0023714 A1 | 1/2008 | Chae et al. | |
| 2008/0128730 A1* | 6/2008 | Fellows | H01L 33/22 |
| | | | 257/98 |
| 2012/0019741 A1* | 1/2012 | Park | G02F 1/133603 |
| | | | 349/62 |
| 2013/0207141 A1* | 8/2013 | Reiherzer | H01L 33/505 |
| | | | 257/98 |

FOREIGN PATENT DOCUMENTS

| | | |
|---|---|---|
| JP | 2012-113837 A | 6/2012 |
| KR | 10-2008-0010535 A | 1/2008 |
| KR | 10-1305925 B1 | 9/2013 |
| KR | 10-2015-0030449 A | 3/2015 |
| KR | 10-1501553 B1 | 3/2015 |

* cited by examiner

|  |  | 1.0F | 0.7F | 0.5F | 0.3F | Center | 0.3F | 0.5F | 0.7F | 1.0F |
|---|---|---|---|---|---|---|---|---|---|---|
| 1.0F | Lux | 16.85 |  |  |  | 31.64 |  |  |  | 17.66 |
|  | % | 27% |  |  |  | 50% |  |  |  | 28% |
| 0.7F | Lux |  | 30.01 |  |  | 41.39 |  |  | 30.16 |  |
|  | % |  | 48% |  |  | 66% |  |  | 48% |  |
| 0.5F | Lux |  |  | 39.24 |  | 48.62 |  | 39.02 |  |  |
|  | % |  |  | 62% |  | 77% |  | 62% |  |  |
| 0.3F | Lux |  |  |  | 50.68 | 57.89 | 49.50 |  |  |  |
|  | % |  |  |  | 81% | 92% | 79% |  |  |  |
| Center | Lux | 19.46 | 32.57 | 44.36 | 53.53 | 62.81 | 53.44 | 42.97 | 32.93 | 19.17 |
|  | % | 31% | 52% | 71% | 85% | 100% | 85% | 68% | 52% | 31% |
| 0.3F | Lux |  |  |  | 50.54 | 57.20 | 49.79 |  |  |  |
|  | % |  |  |  | 80% | 91% | 79% |  |  |  |
| 0.5F | Lux |  |  | 38.43 |  | 50.48 |  | 44.99 |  |  |
|  | % |  |  | 61% |  | 80% |  | 72% |  |  |
| 0.7F | Lux |  | 30.35 |  |  | 43.02 |  |  | 30.22 |  |
|  | % |  | 48% |  |  | 68% |  |  | 48% |  |
| 1.0F | Lux | 16.48 |  |  |  | 32.73 |  |  |  | 16.40 |
|  | % | 26% |  |  |  | 52% |  |  |  | 26% |

[Fig. 8]

|  |  | 1.0F | 0.7F | 0.5F | 0.3F | Center | 0.3F | 0.5F | 0.7F | 1.0F |
|---|---|---|---|---|---|---|---|---|---|---|
| 1.0F | Lux | 18.35 |  |  |  | 31.44 |  |  |  | 17.41 |
|  | % | 29% |  |  |  | 49% |  |  |  | 27% |
| 0.7F | Lux |  | 30.00 |  |  | 42.10 |  |  | 29.84 |  |
|  | % |  | 47% |  |  | 66% |  |  | 47% |  |
| 0.5F | Lux |  |  | 39.31 |  | 49.80 |  | 38.69 |  |  |
|  | % |  |  | 62% |  | 78% |  | 61% |  |  |
| 0.3F | Lux |  |  |  | 50.57 | 57.20 | 48.79 |  |  |  |
|  | % |  |  |  | 79% | 90% | 77% |  |  |  |
| Center | Lux | 19.87 | 33.08 | 44.24 | 54.02 | 63.68 | 53.42 | 44.43 | 32.67 | 18.96 |
|  | % | 31% | 52% | 69% | 85% | 100% | 84% | 70% | 51% | 30% |
| 0.3F | Lux |  |  |  | 50.14 | 58.07 | 49.70 |  |  |  |
|  | % |  |  |  | 79% | 91% | 78% |  |  |  |
| 0.5F | Lux |  |  | 39.47 |  | 51.26 |  | 45.10 |  |  |
|  | % |  |  | 62% |  | 80% |  | 71% |  |  |
| 0.7F | Lux |  | 30.86 |  |  | 43.25 |  |  | 30.91 |  |
|  | % |  | 48% |  |  | 68% |  |  | 49% |  |
| 1.0F | Lux | 17.08 |  |  |  | 32.77 |  |  |  | 17.34 |
|  | % | 27% |  |  |  | 51% |  |  |  | 27% |

|  |  | 1.0F | 0.7F | 0.5F | 0.3F | Center | 0.3F | 0.5F | 0.7F | 1.0F |
|---|---|---|---|---|---|---|---|---|---|---|
| 1.0F | Lux | 19.31 |  |  |  | 34.06 |  |  |  | 18.59 |
|  | % | 29% |  |  |  | 50% |  |  |  | 28% |
| 0.7F | Lux |  | 32.07 |  |  | 44.20 |  |  | 31.37 |  |
|  | % |  | 47% |  |  | 65% |  |  | 46% |  |
| 0.5F | Lux |  |  | 41.18 |  | 53.30 |  | 41.53 |  |  |
|  | % |  |  | 61% |  | 79% |  | 61% |  |  |
| 0.3F | Lux |  |  |  | 52.76 | 59.97 | 52.00 |  |  |  |
|  | % |  |  |  | 78% | 89% | 77% |  |  |  |
| Center | Lux | 22.12 | 35.26 | 46.71 | 57.21 | 67.54 | 57.09 | 46.78 | 35.62 | 22.15 |
|  | % | 33% | 52% | 69% | 85% | 100% | 85% | 69% | 53% | 33% |
| 0.3F | Lux |  |  |  | 52.61 | 61.70 | 52.99 |  |  |  |
|  | % |  |  |  | 78% | 91% | 78% |  |  |  |
| 0.5F | Lux |  |  | 41.41 |  | 53.56 |  | 48.25 |  |  |
|  | % |  |  | 61% |  | 79% |  | 71% |  |  |
| 0.7F | Lux |  | 32.22 |  |  | 46.22 |  |  | 32.20 |  |
|  | % |  | 48% |  |  | 68% |  |  | 48% |  |
| 1.0F | Lux | 19.17 |  |  |  | 35.68 |  |  |  | 18.34 |
|  | % | 28% |  |  |  | 53% |  |  |  | 27% |

[Fig. 12]

|  |  | 1.0F | 0.7F | 0.5F | 0.3F | Center | 0.3F | 0.5F | 0.7F | 1.0F |
|---|---|---|---|---|---|---|---|---|---|---|
| 1.0F | Lux | 19.97 |  |  |  | 34.27 |  |  |  | 18.57 |
|  | % | 29% |  |  |  | 50% |  |  |  | 27% |
| 0.7F | Lux |  | 32.75 |  |  | 43.88 |  |  | 31.50 |  |
|  | % |  | 48% |  |  | 64% |  |  | 46% |  |
| 0.5F | Lux |  |  | 41.11 |  | 53.49 |  | 41.11 |  |  |
|  | % |  |  | 60% |  | 78% |  | 60% |  |  |
| 0.3F | Lux |  |  |  | 52.64 | 61.18 | 51.93 |  |  |  |
|  | % |  |  |  | 77% | 90% | 76% |  |  |  |
| Center | Lux | 22.55 | 34.69 | 47.71 | 56.97 | 68.24 | 57.45 | 47.55 | 35.18 | 22.07 |
|  | % | 33% | 51% | 70% | 83% | 100% | 84% | 70% | 52% | 32% |
| 0.3F | Lux |  |  |  | 53.10 | 61.74 | 52.66 |  |  |  |
|  | % |  |  |  | 78% | 90% | 77% |  |  |  |
| 0.5F | Lux |  |  | 41.69 |  | 55.89 |  | 47.35 |  |  |
|  | % |  |  | 61% |  | 79% |  | 69% |  |  |
| 0.7F | Lux |  | 32.98 |  |  | 46.49 |  |  | 32.12 |  |
|  | % |  | 48% |  |  | 68% |  |  | 47% |  |
| 1.0F | Lux | 19.36 |  |  |  | 35.05 |  |  |  | 18.55 |
|  | % | 28% |  |  |  | 51% |  |  |  | 27% |

[Fig. 13]

|  |  | 1.0F | 0.7F | 0.5F | 0.3F | Center | 0.3F | 0.5F | 0.7F | 1.0F |
|---|---|---|---|---|---|---|---|---|---|---|
| 1.0F | Lux | 21.18 |  |  |  | 34.42 |  |  |  | 19.39 |
|  | % | 31% |  |  |  | 50% |  |  |  | 28% |
| 0.7F | Lux |  | 33.01 |  |  | 45.05 |  |  | 32.02 |  |
|  | % |  | 48% |  |  | 65% |  |  | 46% |  |
| 0.5F | Lux |  |  | 41.29 |  | 53.39 |  | 42.87 |  |  |
|  | % |  |  | 60% |  | 77% |  | 62% |  |  |
| 0.3F | Lux |  |  |  | 53.64 | 62.57 | 52.91 |  |  |  |
|  | % |  |  |  | 77% | 90% | 76% |  |  |  |
| Center | Lux | 23.51 | 36.85 | 47.17 | 58.26 | 69.24 | 58.56 | 47.16 | 37.31 | 23.29 |
|  | % | 34% | 53% | 68% | 84% | 100% | 85% | 68% | 54% | 34% |
| 0.3F | Lux |  |  |  | 53.11 | 64.32 | 54.46 |  |  |  |
|  | % |  |  |  | 77% | 93% | 79% |  |  |  |
| 0.5F | Lux |  |  | 42.08 |  | 54.99 |  | 48.85 |  |  |
|  | % |  |  | 61% |  | 79% |  | 71% |  |  |
| 0.7F | Lux |  | 33.45 |  |  | 47.38 |  |  | 33.11 |  |
|  | % |  | 48% |  |  | 68% |  |  | 48% |  |
| 1.0F | Lux | 19.27 |  |  |  | 35.65 |  |  |  | 20.13 |
|  | % | 28% |  |  |  | 51% |  |  |  | 29% |

[Fig. 14]

|  |  | 1.0F | 0.7F | 0.5F | 0.3F | Center | 0.3F | 0.5F | 0.7F | 1.0F |
|---|---|---|---|---|---|---|---|---|---|---|
| 1.0F | Lux | 22.07 |  |  |  | 35.62 |  |  |  | 19.41 |
|  | % | 31% |  |  |  | 51% |  |  |  | 28% |
| 0.7F | Lux |  | 34.81 |  |  | 45.83 |  |  | 33.13 |  |
|  | % |  | 49% |  |  | 65% |  |  | 47% |  |
| 0.5F | Lux |  |  | 42.43 |  | 52.97 |  | 43.43 |  |  |
|  | % |  |  | 60% |  | 75% |  | 62% |  |  |
| 0.3F | Lux |  |  |  | 54.33 | 63.34 | 52.65 |  |  |  |
|  | % |  |  |  | 77% | 90% | 75% |  |  |  |
| Center | Lux | 23.99 | 37.12 | 49.15 | 58.30 | 70.32 | 58.66 | 48.07 | 37.66 | 22.61 |
|  | % | 34% | 53% | 70% | 83% | 100% | 83% | 68% | 54% | 32% |
| 0.3F | Lux |  |  |  | 53.56 | 63.13 | 54.61 |  |  |  |
|  | % |  |  |  | 76% | 90% | 78% |  |  |  |
| 0.5F | Lux |  |  | 43.56 |  | 53.65 |  | 49.94 |  |  |
|  | % |  |  | 62% |  | 76% |  | 71% |  |  |
| 0.7F | Lux |  | 33.38 |  |  | 48.30 |  |  | 33.92 |  |
|  | % |  | 47% |  |  | 69% |  |  | 48% |  |
| 1.0F | Lux | 20.33 |  |  |  | 36.33 |  |  |  | 19.99 |
|  | % | 29% |  |  |  | 52% |  |  |  | 28% |

[Fig. 15]

LIGHT-EMITTING ELEMENT PACKAGE AND LIGHT-EMITTING ELEMENT MODULE COMPRISING SAME

CROSS REFERENCE TO RELATED APPLICATIONS

This application is the National Phase of PCT International Application No. PCT/KR2016/005381, filed on May 20, 2016, which claims priority under 35 U.S.C. 119(a) to Patent Application No. 10-2015-0094497, filed in the Republic of Korea on Jul. 2, 2015, all of which are hereby expressly incorporated by reference into the present application.

TECHNICAL FIELD

Embodiments relate to a light-emitting element package, and more particularly, to a light-emitting element package having increased central illuminance.

BACKGROUND ART

Group III-V compound semiconductors such as, for example, GaN and AlGaN, are widely used for optoelectronics, electronic devices and the like, owing to many advantages such as, for example, a wide and easily adjustable band gap energy.

In particular, light-emitting elements such as light-emitting diodes or laser diodes using group III-V or II-VI compound semiconductors may realize various colors of light such as, for example, red, green, and blue light, as well as ultraviolet light, via the development of device materials and thin-film growth technique, and may also realize white light having high luminous efficacy via the use of a fluorescent material or by combining colors. These light-emitting elements have advantages of low power consumption, a semi-permanent lifespan, fast response speed, good safety, and eco-friendly properties compared to existing light sources such as, for example, fluorescent lamps and incandescent lamps.

Accordingly, the application of light-emitting elements has been expanded to a transmission module of an optical communication apparatus, a light-emitting diode backlight, which may substitute for a cold cathode fluorescent lamp (CCFL) constituting a backlight of a liquid crystal display (LCD) apparatus, a white light-emitting diode lighting apparatus, which may substitute for a fluorescent lamp or an incandescent bulb, a vehicle headlight, and a signal lamp.

Figure 1:
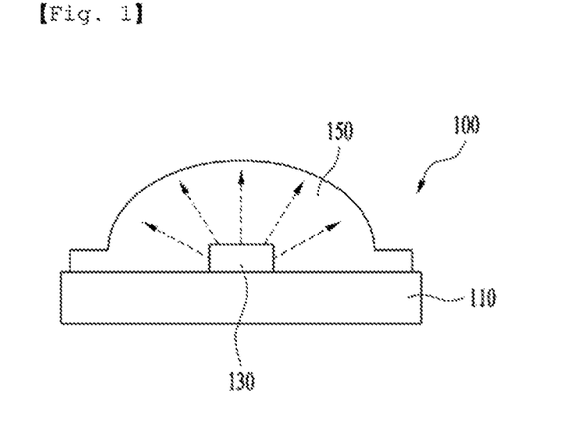
FIG. 1 is a view illustrating a conventional light-emitting element package.

FIG. 1 is a view illustrating a conventional light-emitting element package.

In the light-emitting element package 100, a light-emitting element 130 is disposed on a substrate 110 and a lens 150 is disposed around the light-emitting element 130 to adjust the distribution of light discharged from the light-emitting element 130.

Although not illustrated, a molded part may be disposed around on the light-emitting element 130 to protect, for example, a light-emitting structure or wires. Since light is refracted when passing through the molded part, which is formed of, for example, silicon, the molded part may serve as a primary lens.

In addition, a secondary lens may be used in order to adjust the path along which light is discharged when the light-emitting element is used as a light source. The aforementioned secondary lens is commonly referred to as a "lens".

An optical path may be greatly changed depending on the material of the lens and particularly on the shape thereof. When the lens is used to adjust the distribution of light discharged from the light-emitting element package, in particular, to increase the range of distribution, a light emission angle may be increased, but the distribution of illuminance may suffer, in particular, illuminance in a central area may be reduced.

Technical Object

Embodiments are intended to increase the illuminance of a central area of a light-emitting element package.

Technical Solution

One embodiment provides a light-emitting element package including a substrate, a light-emitting element disposed on the substrate, and a molded part disposed to surround a side surface and an upper surface of the light-emitting element and having a pattern on a surface thereof from which light introduced from the light-emitting element is emitted, wherein the pattern is disposed on a first area corresponding to the light-emitting element and a portion of the pattern is disposed to correspond to a second area around the first area, and the pattern is disposed on the surface of the molded part within an angular range from 120 degrees to 130 degrees.

The light-emitting element package may further include a phosphor layer disposed on the light-emitting element.

The phosphor layer may have a length in a first direction and a length in a second direction, and the length in the first direction may be equal to or greater than the length in the second direction.

The pattern may include a plurality of protrusions, and the protrusions may have the same shape.

Each of the protrusions may have a height within a range from 5% to 25% of a length of the phosphor layer in a first direction.

Each of the protrusions may include a cylindrical body.

Each of the protrusions may further include an upper surface taking the form of a curved surface.

The curved surface may have a radius of curvature of 5% or more of a length of the phosphor layer in a first direction.

The pattern may include a plurality of protrusions, and protrusions disposed on the outermost side may be disposed to correspond both to the first area and to the second area.

Illuminance in an area orthogonal to a center of a surface of a phosphor layer may be greater than illuminance in a direction oblique relative to the surface of the phosphor layer.

Illuminance in a direction of 30 degrees from a surface of a phosphor layer may be 87% or less of illuminance in an area orthogonal to a center of the surface of the phosphor layer.

Another embodiment provides a light-emitting element package including a substrate, a light-emitting element disposed on the substrate, a phosphor layer disposed on the light-emitting element, and a molded part disposed to surround a side surface and an upper surface of the phosphor layer and the light-emitting element and having a pattern on a surface thereof from which light introduced from the light-emitting element is emitted, wherein the pattern includes a plurality of protrusions, and the protrusions have the same shape.

A further embodiment provides a light-emitting element module including a light-emitting element package including a substrate, a light-emitting element disposed on the substrate, and a molded part disposed to surround a side surface and an upper surface of the light-emitting element and having a pattern on a surface thereof from which light introduced from the light-emitting element is emitted, wherein the pattern is disposed on a first area corresponding to the light-emitting element and a portion of the pattern is disposed to correspond to a second area around the first area, and the pattern is disposed on the surface of the molded part within an angular range from 120 degrees to 130 degrees, and a lens disposed on the molded part of the light-emitting element package.

Advantageous Effects

In a light-emitting element package and a light-emitting element module according to embodiments, the illuminance measured at the angular direction of 30 degrees from an emission surface is lower than the illuminance measured in an area orthogonal to the center of the emission surface. Thus, the illuminance measured in the direction orthogonal to the center of the emission surface, i.e. in the angular direction of 0 degrees is relatively high.

BEST MODE

Hereinafter, embodiments will be described in detail with reference to the accompanying drawings, in order to concretely realize the disclosure and to assist the understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "upper" and "lower", used in the following description may be used to distinguish any one substance or element with another substance or element without requiring or containing any physical or logical relationship or sequence between these substances or elements.

Figure 2:
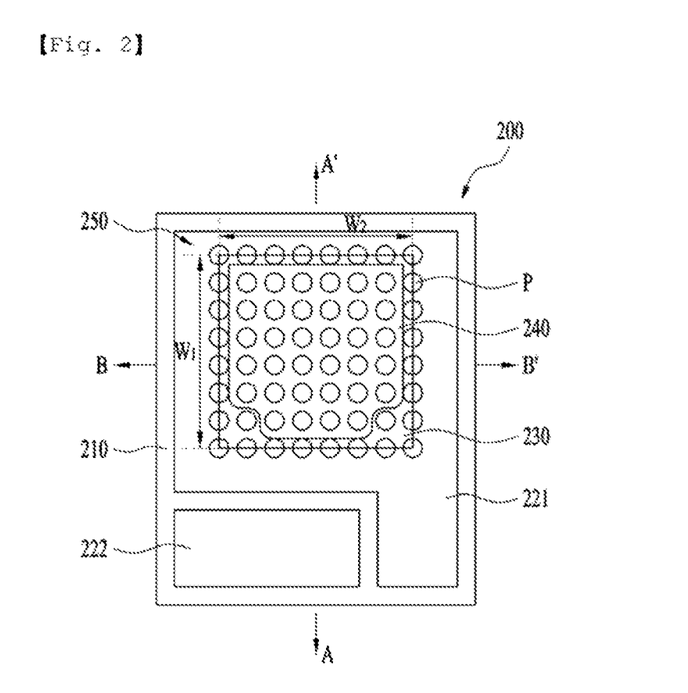
FIG. 2 is a plan view illustrating an embodiment of a light-emitting element package.
Figure 3:
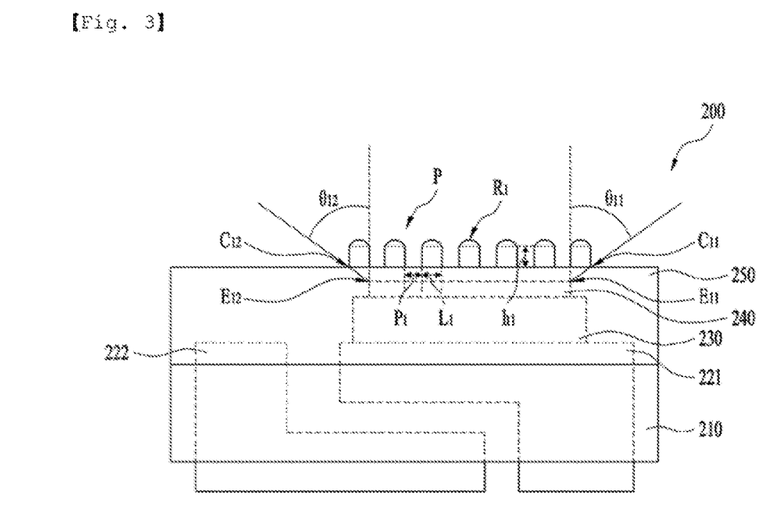
FIG. 3 is a cross-sectional view taken along direction A-A' of FIG. 2.
Figure 4:
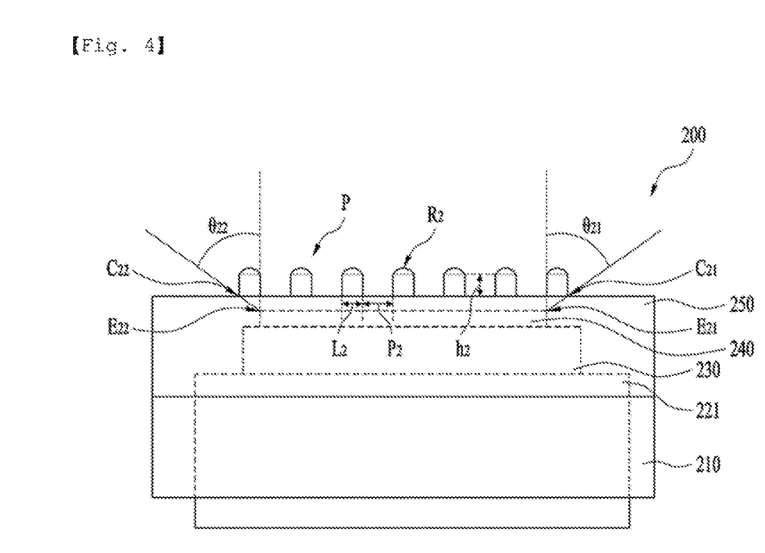
FIG. 4 is a cross-sectional view taken along direction B-B' of FIG. 2.
Figure 5:
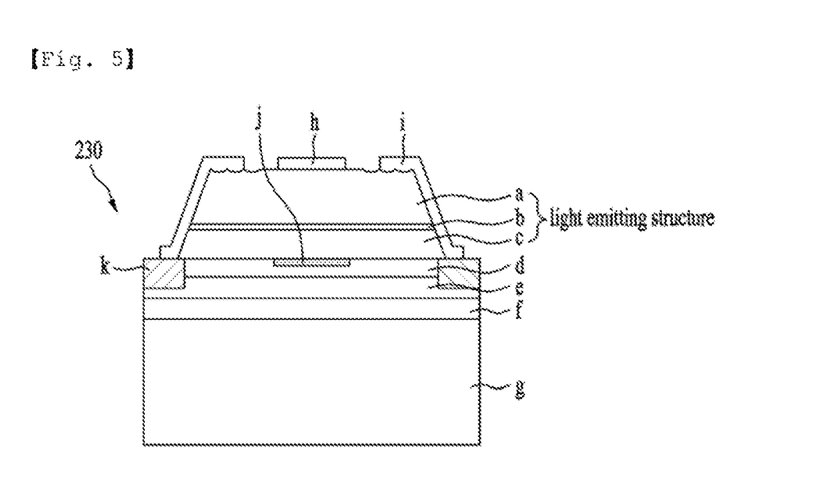
FIG. 5 is a cross-sectional view of a light-emitting element disposed in the light-emitting element package.

FIG. 2 is a plan view illustrating an embodiment of a light-emitting element package, FIG. 3 is a cross-sectional view taken along direction A-A' of FIG. 2, FIG. 4 is a cross-sectional view taken along direction B-B' of FIG. 2, and FIG. 5 is a cross-sectional view of a light-emitting element disposed in the light-emitting element package.

Hereinafter, an embodiment of the light-emitting element package will be described with reference to FIGS. 2 to 4.

The light-emitting element package 200 according to the embodiment includes a substrate 210, a light-emitting element 230 disposed on the substrate 210, a phosphor layer 240 on the light-emitting element 230, and a molded part 250 disposed to surround the substrate 210, the light-emitting element 230, and the phosphor layer 240, and a pattern P is disposed on the surface of the molded part 250.

The substrate 210 may serve as a package body. A silicon substrate or a ceramic-based substrate may be used as the substrate 210.

A first lead frame 221 and a second lead frame 222 are disposed on the substrate 210. The first lead frame 221 and the second lead frame 222 may be disposed so as to penetrate an area of the substrate 210.

The first lead frame 221 is illustrated such that the area thereof exposed from the upper surface of the substrate 210 is greater than the area thereof exposed from the lower surface, and the second lead frame 222 is illustrated such that the area thereof exposed from the upper surface of the substrate 210 is smaller than the area thereof exposed from the lower surface, the invention not necessarily being limited thereto.

Referring to the plan view of FIG. 2, a greater area of the first lead frame 221 than that of the second lead frame 222 is exposed and the light-emitting element 230 is disposed on the exposed area of the first lead frame 221, without necessarily being limited thereto.

The light-emitting element 230 is disposed on an area of the first lead frame 221, and in the plan view of FIG. 2, the light-emitting element 230 is not disposed on the center of the substrate 210, but is offset to the upper side from the center, without necessarily being limited thereto.

Referring to FIG. 5, a light-emitting diode is illustrated as an embodiment of the light-emitting element.

In the light-emitting element, a bonding layer f, a reflective layer e, and an ohmic layer d may be disposed on a support substrate g, a light-emitting structure may be disposed on the ohmic layer, and a channel layer k may be disposed in an edge area under the light-emitting structure.

The support substrate g may be a base substrate, and may be formed of at least one selected from among copper (Cu), gold (Au), nickel (Ni), molybdenum (Mo), and copper-tungsten (Cu—W). In addition, the support substrate g may be configured as a carrier wafer using, for example, Si, Ge, GaAs, ZnO, SiC, SiGe, $Ga_2O_3$, or GaN.

The bonding layer f may be disposed on the support substrate g. The bonding layer f may bond the reflective layer e to the support substrate g. The bonding layer f may include, for example, at least one of Ti, Au, Sn, Ni, Cr, Ga, In, Bi, Cu, Ag and Ta.

The reflective layer e may be formed on the bonding layer f. The reflective layer e may be formed in a single layer or in multiple layers using any one selected from among materials having excellent reflection characteristics, for example, silver (Ag), nickel (Ni), aluminum (Al), rubidium (Rh), palladium (Pd), iridium (Ir), ruthenium (Ru), magnesium (Mg), zinc (An), platinum (Pt), gold (Au), hafnium (Hf), and selective combinations thereof, or using the metal material and a light-transmitting conductive material such as, for example, IZO, IZTO, IAZO, IGZO, IGTO, AZO, or ATO. In addition, the reflective layer e may be, for example, the stack of IZO/Ni, AZO/Ag, IZO/Ag/Ni, or AZO/Ag/Ni, without being limited thereto.

The ohmic layer d may be formed on the reflective layer e. The ohmic layer may be in ohmic contact with the lower surface of the light-emitting structure, and may be configured as a layer or a plurality of patterns. The ohmic layer d may selectively use a light-transmitting electrode layer and a metal, and may be formed in a single layer or in multiple layers using one or more selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

The support substrate g, the bonding layer f, the reflective layer e, and the reflective layer d may form a first electrode, and may supply current to the light-emitting structure.

The channel layer k may be disposed between the first electrode and the light-emitting structure. The channel layer k may be disposed in the edge area under the light-emitting structure, and may be formed of a light-transmitting material such as, for example, a metal oxide, a metal nitride, a light-transmitting nitride, or a light-transmitting oxide, may be formed as a light-transmitting insulation layer. For example, the channel layer k may be formed using one selected from among indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SiO2, SiOx, SiOxNy, Si3N4, Al2O3 and TiO2.

The light-emitting structure may be disposed on the first electrode. The light-emitting structure includes a first conductive semiconductor layer a, an active layer b, and a second conductive semiconductor layer c.

The first conductive semiconductor layer a may be formed using, for example, group III-V or II-VI compound semiconductors, and may be doped with a first conductive dopant. The first conductive semiconductor layer a may be formed of a semiconductor material having a composition equation of $Al_xIn_yGa_{(1-x-y)}N$ ($0 \leq x \leq 1$, $0 \leq y \leq 1$, $0 \leq x+y \leq 1$), for example, any one or more selected from among AlGaN, GaN, InAlGaN, AlGaAs, GaP, GaAs, GaAsP, and AlGaInP.

When the first conductive semiconductor layer a is an n-type semiconductor layer, the first conductive dopant may include an n-type dopant such as, for example, Si, Ge, Sn, Se, or Te. The first conductive semiconductor layer a may be formed in a single layer or in multiple layers, without being limited thereto.

The active layer b may be disposed between the first conductive semiconductor layer a and the second conductive semiconductor layer c, and may include any one of a single well structure, a multi-well structure, a single quantum well structure, a multi quantum well (MQW) structure, a quantum dot structure, and a quantum line structure.

The active layer b may have any one or more pair structures of a well layer and a barrier layer using group III-V compound semiconductors, for example, AlGaN/AlGaN, InGaN/GaN, InGaN/InGaN, AlGaN/GaN, InAlGaN/GaN, GaAs(InGaAs)/AlGaAs, and GaP(InGaP)/AlGaP, without being limited thereto.

The well layer may be formed of a material that has a smaller energy band gap than the energy band gap of the barrier layer.

The second conductive semiconductor layer b may be formed using compound semiconductors. The second conductive semiconductor layer c may be formed of, for example, group III-V or II-VI compound semiconductors, and may be doped with a second conductive dopant. The second conductive semiconductor layer c may be formed of a semiconductor material having a composition equation of $In_xAl_yGa_{(1-x-y)}N$ ($0 \leq x \leq 1$, $0 \leq y \leq 1$, $0 \leq x+y \leq 1$), for example, any one or more selected from among AlGaN, GaN, AlInN, AlGaAs, GaP, GaAs, GaAsP, and AlGaInP.

When the second conductive semiconductor layer c is a p-type semiconductor layer, the second conductive dopant may be a p-type dopant such as, for example, Mg, Zn, Ca, Sr or Ba. The second conductive semiconductor layer c may be formed in a single layer or in multiple layers, without being limited thereto.

Although not illustrated, an electron blocking layer may be disposed between the active layer b and the second conductive semiconductor layer c. The electron blocking layer may have the structure of a super-lattice. For example, the super-lattice may be formed by disposing AlGaN doped with a second conductive dopant and alternately disposing a plurality of GaN layers having different composition rates of aluminum, without being limited thereto.

The surface of the first conductive semiconductor layer a may have a pattern such as, for example, convex and concave portions in order to increase light extraction efficiency. A second electrode h is disposed on the surface of the first conductive semiconductor layer a. As illustrated, the surface of the first conductive semiconductor layer a, on which the second electrode h is disposed, may or may not be patterned along the surface of the first conductive semiconductor layer a. The second electrode h may be formed in a single layer or in multiple layers using at least one selected from among aluminum (Al), titanium (Ti), chrome (Cr), nickel (Ni), copper (Cu), and gold (Au).

A current blocking layer j may be disposed under the light-emitting structure so as to correspond to the second electrode h. The current blocking layer j may be formed using an insulating material. The current blocking layer j may cause the current supplied from the direction of the support substrate g to be uniformly supplied to the entire area of the second conductive semiconductor layer c.

A passivation layer i may be formed around the light-emitting structure. The passivation layer i may be formed of an insulating material, and the insulating material may include a non-conductive oxide or nitride. In one example, the passivation layer i may be configured as a silicon oxide ($SiO_2$) layer, a nitride oxide layer, or an aluminum oxide layer.

Although FIG. 5 illustrates a vertical light-emitting element, any one of various other light sources such as, for example, a horizontal light-emitting element or a flip-chip-type light-emitting element may be disposed.

The phosphor layer 240 may be disposed on the top of the light-emitting element 230 to have a predetermined thickness via, for example, conformal coating. The horizontal cross-sectional area of the phosphor layer 240 may be smaller than the horizontal cross-sectional area of the light-emitting element 230 so that the phosphor layer 240 may not be disposed on an edge area of the light-emitting element 230.

Thus, in FIG. 2, the edge area of the light-emitting element 230 on which the phosphor layer 240 is not disposed may be disposed to surround the surface of the light-emitting element 230 that comes into contact with the phosphor layer 240.

When the light-emitting element package according to the present embodiment is used in a light source of a mobile terminal or the like, the light that proceeds to the upper surface may be used, but the light that proceeds to the side surface may not be used, and the light source of the mobile terminal may be provided with an opening having the same area as that of the above-described phosphor layer 240. Here, since the edge area of the light-emitting element 230 in which the phosphor layer 240 is not disposed is disposed outside the aforementioned opening, the light that is discharged from the edge area of the light-emitting element 230 may not be discharged to the outside of the mobile terminal.

The phosphor layer 240 may be formed using silicate-based, nitride-based, or YAG-based phosphors, and may discharge light within a second wavelength range when excited by light within a first wavelength range, which is discharged from the light-emitting element 230.

The molded part 250 may be formed of silicon or any other light-transmitting material. The molded part 250 may be disposed in contact with the substrate 210 so as to surround the first lead frame 221 and the second lead frame 222, which are exposed from the substrate 210, and to surround the side surface and at least a portion of the upper surface of the light-emitting element 230 and the phosphor layer 240.

Referring to FIGS. 2 to 4, the pattern P may include a plurality of protrusions, and the protrusions may have the same shape and may be disposed on the surface of the molded part 250. The central area of the upper surface of the molded part 250 that corresponds to the light-emitting element 230 may be referred to as a first area and the peripheral area around the first area may be referred to as a second area.

Here, some of the protrusions that are disposed on the outermost side may be disposed so as to correspond both to both the first area and to the second area. In this case, referring to FIGS. 3 and 4, the aforementioned protrusions that are disposed on the outermost side may vertically overlap the edge of the light-emitting element 230. In addition, the other protrusions excluding the aforementioned protrusions that are disposed on the outermost side may be disposed on the first area described above so as to vertically overlap the upper surface of the light-emitting element 230.

In FIG. 3, assuming that the upper surface of the phosphor layer 240 is an emission surface, the angle $\Theta_{11}$ between a virtual line (represented by a dotted line), which extends from one edge $E_{11}$ of the emission surface so as to be orthogonal to the emission surface, and a virtual line (represented by a solid line), which interconnects the edge $E_{11}$ of the emission surface and the point $C_{11}$ at which the protrusion on the edge and the surface of the molded part 240 meet each other, may range from 60 degrees to 65 degrees.

In addition, the angle $\Theta_{12}$ between a virtual line (represented by a dotted line), which extends from the other edge $E_{12}$ of the emission surface so as to be orthogonal to the emission surface, and a virtual line (represented by a solid line), which interconnects the edge $E_{12}$ of the emission surface and the point $C_{12}$ at which the protrusion on the edge and the surface of the molded part 240 meet each other, may be the same as the above-described angle $\Theta_{11}$ and may range from 60 degrees to 65 degrees.

In FIG. 4, assuming that the upper surface of the phosphor layer 240 is an emission surface, the angle $\Theta_{21}$ between a virtual line (represented by a dotted line), which extends from one edge $E_{21}$ of the emission surface so as to be orthogonal to the emission surface, and a virtual line (represented by a solid line), which interconnects the edge $E_{21}$ of the emission surface and the point $C_{21}$ at which the protrusion on the edge and the surface of the molded part 240 meet each other, may range from 60 degrees to 65 degrees.

In addition, the angle $\Theta_{22}$ between a virtual line (represented by a dotted line), which extends from the other edge $E_{22}$ of the emission surface so as to be orthogonal to the emission surface, and a virtual line (represented by a solid line), which interconnects the edge $E_{22}$ of the emission surface and the point $C_{22}$ at which the protrusion on the edge and the surface of the molded part 240 meet each other, may be the same as the above-described angle $\Theta_{21}$ and may range from 60 degrees to 65 degrees.

When the emission surface, which is the surface of the phosphor layer 240, and the pattern P are disposed as described above, the pattern P may be disposed on the surface of the phosphor layer 240 within the range from 120 degrees to 130 degrees, and the above-described angles may be greater than the view angle of light discharged from the light-emitting element 230.

When the pattern is disposed on the surface of the phosphor layer 240 within an angular range below 120 degrees, some of the light discharged from the light-emitting element and the phosphor layer may not be refracted by the pattern P. When the pattern is disposed on the surface of the phosphor layer 240 within an angular range above 130 degrees, light may be refracted at the surface of the phosphor layer 240 beyond the edge of the emission surface, which may increase illuminance in areas other than the center area. "Illuminance" indicates the quantity of light incident on a subject surface, and the unit thereof is indicated by lx or lux.

In FIG. 2, assuming that the direction A-A' is referred to as a first-axis direction and the direction B-B' is referred to as a second-axis direction, the length $W_1$ of the emission surface of the light-emitting element 230 in the first-axis direction may be equal to or greater than the length $W_2$ of the emission surface in the second-axis direction. Here, the "emission surface" means the surface of the phosphor layer.

Each protrusion may include a cylindrical body and a curved upper surface of the body. The cylindrical shape may increase the uniformity of direction of light discharged from the molded part and the curved surface may refract the light discharged outward from the protrusion and prevent total reflection of the light.

In FIG. 3, the respective protrusions may be spaced apart from one another by a predetermined distance $P_1$ and the height $h_1$ of each protrusion may range from 5% to 25% of the length $W_1$ of the emission surface of the light-emitting element 230 in the first-axis direction, and may, for example, be 0.1 mm.

The radius of curvature $R_1$ of the curved upper surface of the body, which constitutes each protrusion, may be 5% or more of the length $W_1$ of the emission surface of the light-emitting element 230 in the first-axis direction, and may, for example, be 0.07 mm.

In addition, the width $L_1$ of each protrusion may be changed based on the length $W_1$ of the emission surface of the light-emitting element 230 in the first-axis direction and the length $W_2$ of the emission surface in the second-axis direction.

In FIG. 4, the distance $P_2$ between the respective protrusions, the height $h_2$ of each protrusion, the radius of curvature $R_2$ of the curved upper surface of the body, which constitutes each protrusion, and the width $L_2$ of each protrusion may respectively the same as the distance $P_1$ between the respective protrusions, the height $h_1$ of each protrusion, the radius of curvature $R_1$ of the curved upper surface of the body, which constitutes each protrusion, and the width $L_1$ of each protrusion described in FIG. 3.

Table 1 illustrates the height $h_2$ of each protrusion, the radius of curvature $R_2$ of the curved surface, the beam angle, the field angle, and the relative illuminance of the light-emitting element package. Here, the illuminance (0 degrees/ 30 degrees) is the ratio of the illuminance measured in the area (0 degrees) orthogonal to the center of the emission surface to the illuminance measured at 30 degrees from the emission surface. The illuminance is measured at an area spaced apart from the emission surface by 1 m in the direction orthogonal thereto.

It can be found that the illuminance (0 degrees/30 degrees) is increased when the protrusion having the height and the radius of curvature described above is formed, compared to the case where no pattern of protrusions is formed.

TABLE 1

| $h_1$ (mm) | $R_1$ (mm) | Beam Angle | Field Angle | Illuminance (0°/30°) |
|---|---|---|---|---|
| 0 | 0 | 120.29 | 176.43 | 114.47 |
| 0.05 | 0.13 | 120.2 | 178.02 | 115.17 |
| 0.05 | 0.06 | 119.12 | 179.35 | 114.60 |
| 0.01 | 0.13 | 120.44 | 178.25 | 115.41 |
| 0.1 | 0.06 | 119.65 | 179.26 | 116.39 |
| 0.15 | 0.13 | 121.11 | 178.25 | 118.54 |
| 0.15 | 0.06 | 119.78 | 179 | 119.13 |
| 0.2 | 0.13 | 121.72 | 178.31 | 119.34 |
| 0.2 | 0.06 | 120.13 | 178.73 | 119.58 |

The light emitted from the light-emitting element package may have various luminosity distributions depending on the angle thereof. The beam angle indicates the range of distribution of light having half of the maximum luminosity, and the field angle indicates the range of distribution of light having one tenth of the maximum luminosity. Here, "luminosity" indicates the intensity of light discharged in a particular direction from a light source, and the unit thereof is candela (cd).

Figure 6A:
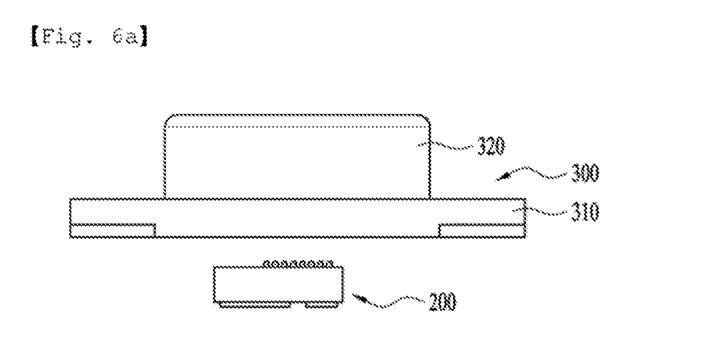
FIGS. 6a to 6c are views illustrating a lens disposed on the light-emitting element package.
Figure 6B:
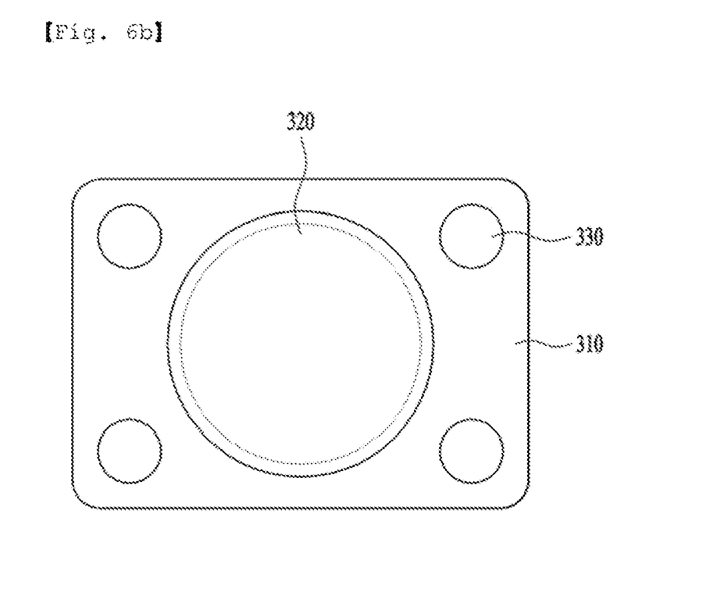
Figure 6C:
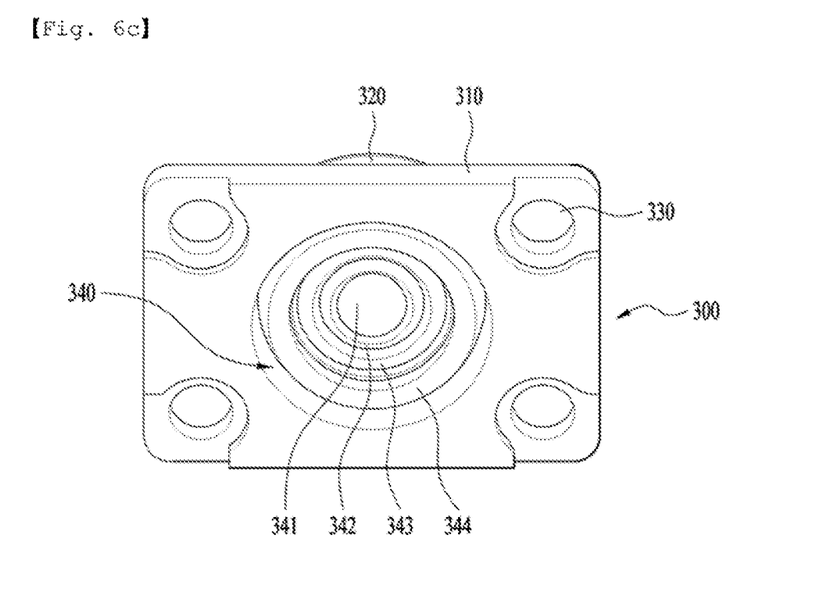

FIGS. 6a to 6c are views illustrating a lens disposed on the light-emitting element package.

A lens 300 is disposed on the light-emitting element package 200. The light-emitting element package 200 may be the same as that in the above-described embodiment, and thus, the lens 300 may be disposed on the molded part.

The lens 300 may be configured such that a light refractor 320 is disposed on a body 310, and holes 330 may be formed in the respective corners of the body 310.

A cavity 340 is defined by the inner side surface of the light refractor 320. Concentric patterns 341 to 344 may be disposed in the cavity 340 to change the path of light discharged from the light-emitting element package 200.

Any of various other shapes of lenses excluding the lens 300 may be disposed on the light-emitting element package 200.

Table 2 illustrates the distribution of illuminance of the light-emitting element package when the horizontal and vertical lengths of the emission surface of the light-emitting element are 0.9 mm, the height h1 of each protrusion is 5% of the horizontal and vertical lengths of the above-described emission surface, i.e. 0.045 mm, and the radius of curvature of the above-described curved surface is 5% of the horizontal and vertical lengths of the above-described emission surface, i.e. 0.045 mm.

Here, in FIGS. 3 and 4, the angle $\Theta_{11}$ and the angle $\Theta_{12}$ may respectively be 61.21 degrees and 61.74 degrees, and the angle $\Theta_{21}$ and the angle $\Theta_{22}$ may respectively be 61.21 degrees and 61.74 degrees, which are the same as in the embodiment of Table 3 to Table 7.

TABLE 2

|  | Light-Emitting Element Package (%) |
|---|---|
| Relative Illuminance (5°) | 97.75 |
| Relative Illuminance (10°) | 96.19 |
| Relative Illuminance (15°) | 94.97 |
| Relative Illuminance (20°) | 94.14 |
| Relative Illuminance (25°) | 89.40 |
| Relative Illuminance (30°) | 86.14 |

The relative illuminance $\Theta$ degrees is the ratio of the illuminance measured at an angle of $\Theta$ degrees from the emission surface, to the illuminance measured in the area orthogonal to the center of the emission surface. Although not shown in Table 2, a relative illuminance of 0 degrees corresponds to 100%.

In Table 2, it can be seen that the illuminance measured at 30 degrees from the emission surface with respect to the illuminance measured in the area orthogonal to the center of the emission surface is 86.14%.

Table 3 illustrates the distribution of illuminance of the light-emitting element package when the horizontal and vertical lengths of the emission surface of the light-emitting element are 0.9 mm, the height h1 of each protrusion is 4% of the horizontal and vertical lengths of the above-described emission surface, i.e. 0.036 mm, and the radius of curvature of the above-described curved surface is 5% of the horizontal and vertical lengths of the above-described emission surface, i.e. 0.045 mm.

TABLE 3

|  | Light-Emitting Element Package (%) |
|---|---|
| Relative Illuminance (5°) | 97.79 |
| Relative Illuminance (10°) | 97.07 |
| Relative Illuminance (15°) | 96.19 |
| Relative Illuminance (20°) | 94.26 |
| Relative Illuminance (25°) | 90.41 |
| Relative Illuminance (30°) | 87.63 |

In Table 3, it can be seen that the illuminance measured at 30 degrees from the emission surface with respect to the illuminance measured in the area orthogonal to the center of the emission surface is 87.63%.

Table 4 illustrates the distribution of illuminance of the light-emitting element package when the horizontal and vertical lengths of the emission surface of the light-emitting element are 0.9 mm, the height h1 of each protrusion is 25% of the horizontal and vertical lengths of the above-described emission surface, i.e. 0.225 mm, and the radius of curvature of the above-described curved surface is 5% of the horizontal and vertical lengths of the above-described emission surface, i.e. 0.045 mm.

TABLE 4

|  | Light-Emitting Element Package (%) |
| --- | --- |
| Relative Illuminance (5°) | 93.52 |
| Relative Illuminance (10°) | 88.80 |
| Relative Illuminance (15°) | 88.73 |
| Relative Illuminance (20°) | 86.22 |
| Relative Illuminance (25°) | 85.52 |
| Relative Illuminance (30°) | 82.96 |

In Table 4, it can be found that the illuminance measured at 30 degrees from the emission surface with respect to the illuminance measured in the area orthogonal to the center of the emission surface is 82.96%.

Table 5 illustrates the distribution of illuminance of the light-emitting element package when the horizontal and vertical lengths of the emission surface of the light-emitting element are 0.9 mm, the height h1 of each protrusion is 26% of the horizontal and vertical lengths of the above-described emission surface, i.e. 0.234 mm, and the radius of curvature of the above-described curved surface is 5% of the horizontal and vertical lengths of the above-described emission surface, i.e. 0.045 mm.

TABLE 5

|  | Light-Emitting Element Package (%) |
| --- | --- |
| Relative Illuminance (5°) | 92.94 |
| Relative Illuminance (10°) | 89.08 |
| Relative Illuminance (15°) | 88.06 |
| Relative Illuminance (20°) | 87.64 |
| Relative Illuminance (25°) | 87.53 |
| Relative Illuminance (30°) | 87.42 |

In Table 5, it can be found that the illuminance measured at 30 degrees from the emission surface with respect to the illuminance measured in the area orthogonal to the center of the emission surface is 87.42%.

Table 6 illustrates the distribution of illuminance of the light-emitting element package when the horizontal and vertical lengths of the emission surface of the light-emitting element are 0.9 mm, and no protrusion is formed on the surface of the molded part.

TABLE 6

|  | Light-Emitting Element Package (%) |
| --- | --- |
| Relative Illuminance (5°) | 99.73 |
| Relative Illuminance (10°) | 98.52 |
| Relative Illuminance (15°) | 97.09 |
| Relative Illuminance (20°) | 94.66 |
| Relative Illuminance (25°) | 91.64 |
| Relative Illuminance (30°) | 87.36 |

In Table 6, it can be found that the illuminance measured at 30 degrees from the emission surface with respect to the illuminance measured in the area orthogonal to the center of the emission surface is 87.36%.

In Table 2, the height $h_1$ and the radius of curvature $R_1$ of the protrusions are respectively 5% and 5% of the horizontal and vertical lengths of the emission surface of the light-emitting element, and in Table 4, the height $h_1$ and the radius of curvature $R_1$ of the protrusions are respectively 25% and 5% of the horizontal and vertical lengths of the emission surface of the light-emitting element. The illuminance measured at 30 degrees from the emission surface with respect to the illuminance measured in the area orthogonal to the center of the emission surface is 86.14% in Table 2 and is 82.96% in Table 4.

In Table 3, the height $h_1$ and the radius of curvature $R_1$ of the protrusions are respectively 4% and 5% of the horizontal and vertical lengths of the emission surface of the light-emitting element, and in Table 5, the height $h_1$ and the radius of curvature $R_1$ of the protrusions are respectively 26% and 5% of the horizontal and vertical lengths of the emission surface of the light-emitting element. In table 6, no protrusion is formed on the surface of the molded part. The illuminance measured at 30 degrees from the emission surface with respect to the illuminance measured in the area orthogonal to the center of the emission surface is 87.63% in Table 3, is 87.42% in Table 5, and is 87.36% in Table 6.

Thus, it can be found that, when the height $h_1$ of the protrusions ranges from 5% to 25% of the length of one side of the emission surface of the light-emitting element and the radius of curvature $R_1$ of the protrusions is 5% or more of the length of one side of the emission surface of the light-emitting element, the illuminance measured at 30 degrees from the emission surface is lower than the illuminance measured in the area orthogonal to the center of the emission surface, and thus the illuminance measured in the direction orthogonal to the center of the emission surface, i.e. in the direction of 0 degrees is relatively high.

In Table 3, because the height $h_1$ of the protrusions is too small to ensure sufficient refraction of light by the protrusions, the quantity of light that proceeds to the area orthogonal to the center of the emission surface may be smaller than those in other embodiments.

In Table 5, because the height $h_1$ of the protrusions is excessively large, causing the light discharged from the emission surface to proceed in the direction orthogonal to the emission surface, i.e. upward in FIGS. 3 and 4, rather than being sufficiently refracted to the central area, the luminance of light in the direction of 30 degrees from the emission surface may increase.

FIGS. 7 to 14 are views illustrating the distribution of illuminance of light discharged from a light-emitting element module in which the above-described lens is disposed.

Figure 7:
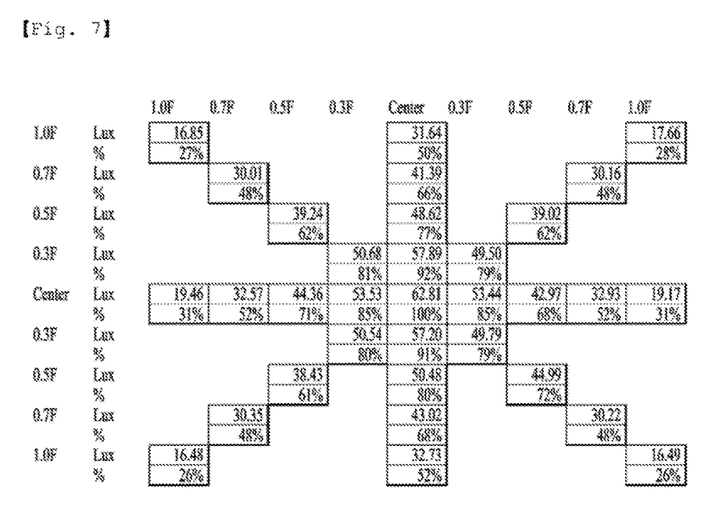
FIGS. 7 to 14 are views illustrating the distribution of illuminance of light discharged from a light-emitting element module in which the above-described lens is disposed.

FIG. 7 illustrates the case in which each of the horizontal and vertical lengths of the emission surface is 0.9 mm and no protrusion is formed on the light-emitting element package, i.e. the surface of the molded part is flat. In this case, the beam angle is 120.29 degrees, the field angle is 176.43 degrees, the relative illuminance (0 degrees) is 100%, the relative illuminance (5 degrees) is 99.73%, the relative illuminance (10 degrees) is 98.52%, the relative illuminance (15 degrees) is 97.09%, the relative illuminance (20 degrees) is 94.66%, the relative illuminance (25 degrees) is 91.64%, and the relative illuminance (30 degrees) is 87.36%.

In the present embodiment, it can be found that the illuminance measured at 30 degrees from the emission surface with respect to the illuminance measured in the area orthogonal to the center of the emission surface is 87.36%.

Figure 8:
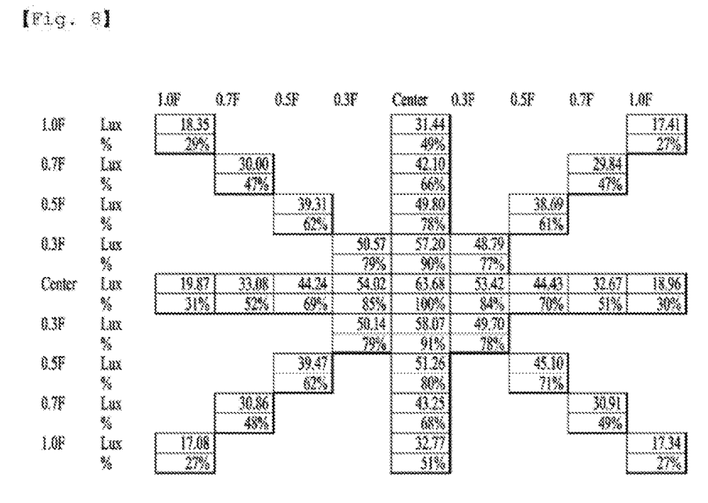

FIG. 8 illustrates the case in which each of the horizontal and vertical lengths of the emission surface is 0.9 mm, the height $h_1$ of each protrusion is 0.05 mm, and the radius of curvature $R_1$ of the above-described curved surface is 0.13 mm. In this case, the beam angle is 120.2 degrees, the field angle is 178.02 degrees, the relative illuminance (0 degrees) is 100%, the relative illuminance (5 degrees) is 98.37%, the relative illuminance (10 degrees) is 97.11%, the relative illuminance (15 degrees) is 94.95%, the relative illuminance (20 degrees) is 93.62%, the relative illuminance (25 degrees) is 90.47%, and the relative illuminance (30 degrees) is 86.83%.

In the present embodiment, it can be found that the illuminance measured at 30 degrees from the emission surface with respect to the illuminance measured in the area orthogonal to the center of the emission surface is 86.83%.

Figure 9:
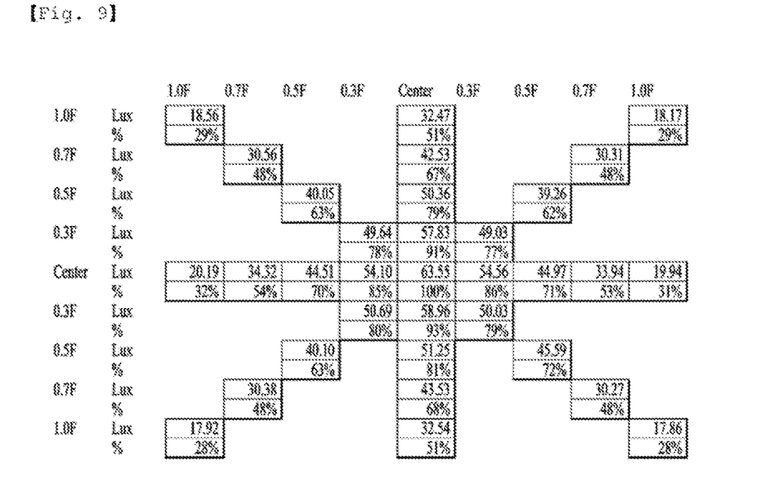

FIG. 9 illustrates the case in which each of the horizontal and vertical lengths of the emission surface is 0.9 mm, the height $h_1$ of each protrusion is 0.1 mm, and the radius of curvature $R_1$ of the above-described curved surface is 0.13 mm. In this case, the beam angle is 120.44 degrees, the field angle is 178.25 degrees, the relative illuminance (0 degrees) is 100%, the relative illuminance (5 degrees) is 97.77%, the relative illuminance (10 degrees) is 96.03%, the relative illuminance (15 degrees) is 94.63%, the relative illuminance (20 degrees) is 93.14%, the relative illuminance (25 degrees) is 90.51%, and the relative illuminance (30 degrees) is 86.65%.

In the present embodiment, it can be found that the illuminance measured at 30 degrees from the emission surface with respect to the illuminance measured in the area orthogonal to the center of the emission surface is 86.65%.

Figure 10:
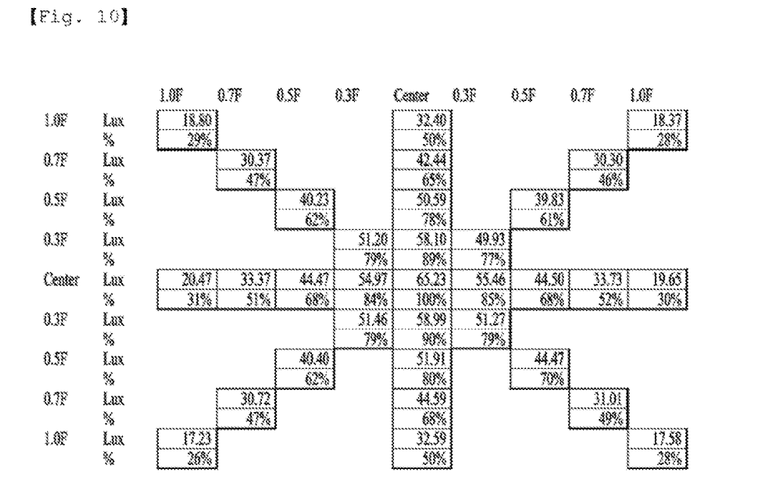

FIG. 10 illustrates the case in which each of the horizontal and vertical lengths of the emission surface is 0.9 mm, the height $h_1$ of each protrusion is 0.1 mm, and the radius of curvature $R_1$ of the above-described curved surface is 0.06 mm. In this case, the beam angle is 119.65 degrees, the field angle is 179.26 degrees, the relative illuminance (0 degrees) is 100%, the relative illuminance (5 degrees) is 97.75%, the relative illuminance (10 degrees) is 96.18%, the relative illuminance (15 degrees) is 95.10%, the relative illuminance (20 degrees) is 93.42%, the relative illuminance (25 degrees) is 89.98%, and the relative illuminance (30 degrees) is 85.91%.

In the present embodiment, it can be found that the illuminance measured at 30 degrees from the emission surface with respect to the illuminance measured in the area orthogonal to the center of the emission surface is 85.91%.

Figure 11:
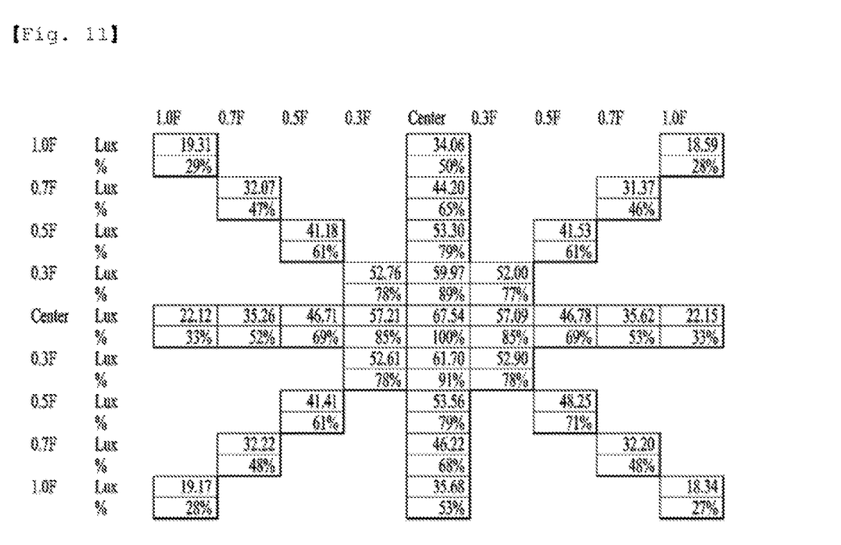

FIG. 11 illustrates the case in which each of the horizontal and vertical lengths of the emission surface is 0.9 mm, the height $h_1$ of each protrusion is 0.15 mm, and the radius of curvature $R_1$ of the above-described curved surface is 0.13 mm. In this case, the beam angle is 121.11 degrees, the field angle is 178.25 degrees, the relative illuminance (0 degrees) is 100%, the relative illuminance (5 degrees) is 96.54%, the relative illuminance (10 degrees) is 93.43%, the relative illuminance (15 degrees) is 91.43%, the relative illuminance (20 degrees) is 90.58%, the relative illuminance (25 degrees) is 87.55%, and the relative illuminance (30 degrees) is 84.36%.

In the present embodiment, it can be found that the illuminance measured at 30 degrees from the emission surface with respect to the illuminance measured in the area orthogonal to the center of the emission surface is 84.36%.

Figure 12:
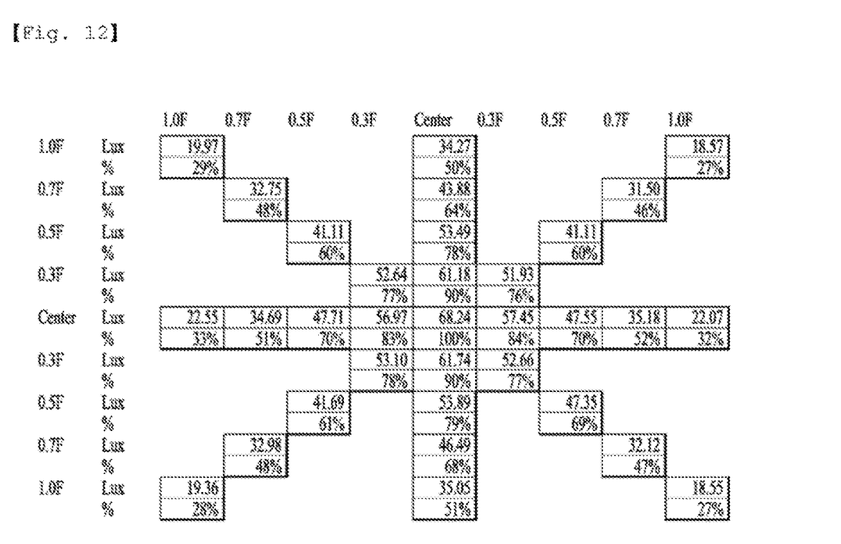

FIG. 12 illustrates the case in which each of the horizontal and vertical lengths of the emission surface is 0.9 mm, the height $h_1$ of each protrusion is 0.15 mm, and the radius of curvature $R_1$ of the above-described curved surface is 0.06 mm. In this case, the beam angle is 119.78 degrees, the field angle is 179 degrees, the relative illuminance (0 degrees) is 100%, the relative illuminance (5 degrees) is 97.33%, the relative illuminance (10 degrees) is 94.00%, the relative illuminance (15 degrees) is 92.47%, the relative illuminance (20 degrees) is 90.11%, the relative illuminance (25 degrees) is 86.35%, and the relative illuminance (30 degrees) is 83.94%.

In the present embodiment, it can be found that the illuminance measured at 30 degrees from the emission surface with respect to the illuminance measured in the area orthogonal to the center of the emission surface is 83.94%.

Figure 13:
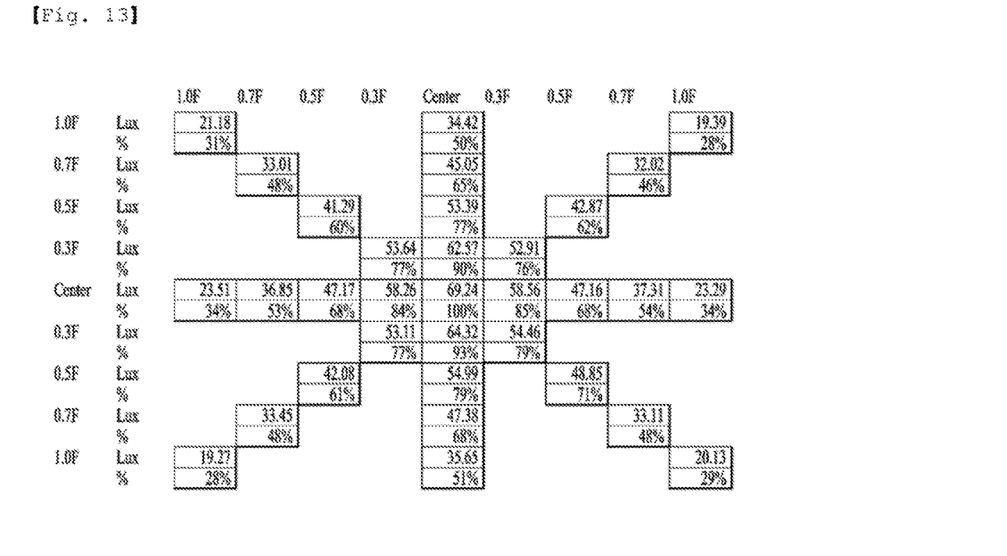

FIG. 13 illustrates the case in which each of the horizontal and vertical lengths of the emission surface is 0.9 mm, the height $h_1$ of each protrusion is 0.2 mm, and the radius of curvature $R_1$ of the above-described curved surface is 0.13 mm. In this case, the beam angle is 121.72 degrees, the field angle is 178.31 degrees, the relative illuminance (0 degrees) is 100%, the relative illuminance (5 degrees) is 95.10%, the relative illuminance (10 degrees) is 90.83%, the relative illuminance (15 degrees) is 89.90%, the relative illuminance (20 degrees) is 88.04%, the relative illuminance (25 degrees) is 85.96%, and the relative illuminance (30 degrees) is 83.79%.

In the present embodiment, it can be found that the illuminance measured at 30 degrees from the emission surface with respect to the illuminance measured in the area orthogonal to the center of the emission surface is 83.79%.

Figure 14:
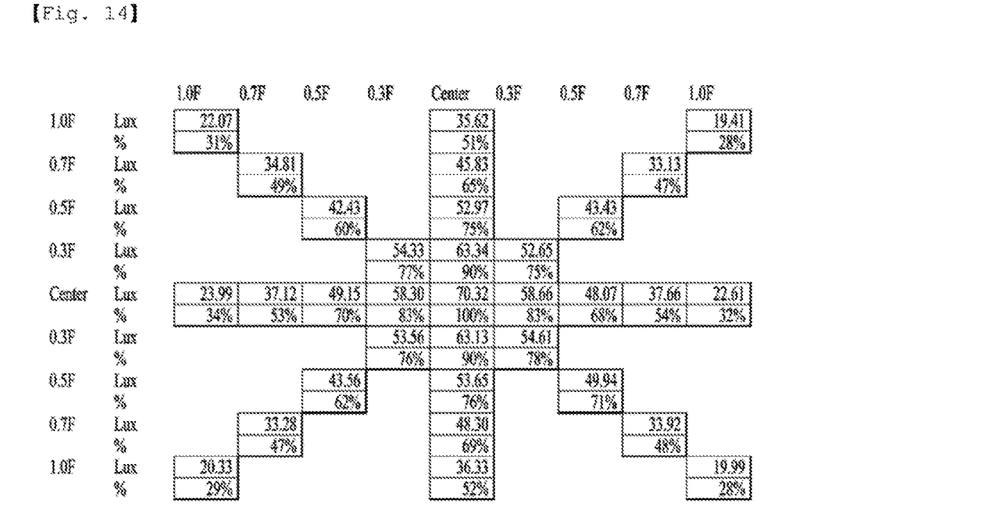

FIG. 14 illustrates the case in which each of the horizontal and vertical lengths of the emission surface is 0.9 mm, the height $h_1$ of each protrusion is 0.2 mm, and the radius of curvature $R_1$ of the above-described curved surface is 0.06 mm. In this case, the beam angle is 120.13 degrees, the field angle is 178.73 degrees, the relative illuminance (0 degrees) is 100%, the relative illuminance (5 degrees) is 96.06%, the relative illuminance (10 degrees) is 91.64%, the relative illuminance (15 degrees) is 88.67%, the relative illuminance (20 degrees) is 87.03%, the relative illuminance (25 degrees) is 86.03%, and the relative illuminance (30 degrees) is 83.63%.

In the present embodiment, it can be found that the illuminance measured at 30 degrees from the emission surface with respect to the illuminance measured in the area orthogonal to the center of the emission surface is 83.63%.

As illustrated in FIGS. 7 to 14, even in the case of the light-emitting element module in which the lens is disposed on the light-emitting element package, compared to the case where no protrusion is formed on the molded part of the light-emitting element package, when a pattern of protrusions is formed, the height $h_1$ of the protrusions ranges from 5% to 25% of the horizontal and vertical lengths of the emission surface of the light-emitting element, and the radius of curvature $R_1$ of the above-described curved surface is 5% or more of the horizontal and vertical lengths of the emission surface of the light-emitting element, the illuminance measured at 30 degrees from the emission surface is lower than the illuminance measured in the area orthogonal to the center of the emission surface, and thus the illuminance measured in the direction orthogonal to the center of the emission surface, i.e. in the direction of 0 degrees is relatively high.

The light-emitting element package or the light-emitting element module described above is increased in the illuminance of the central area, thereby being usable as a light source for various devices, more particularly, as a light source for a mobile terminal.

Figure 15:
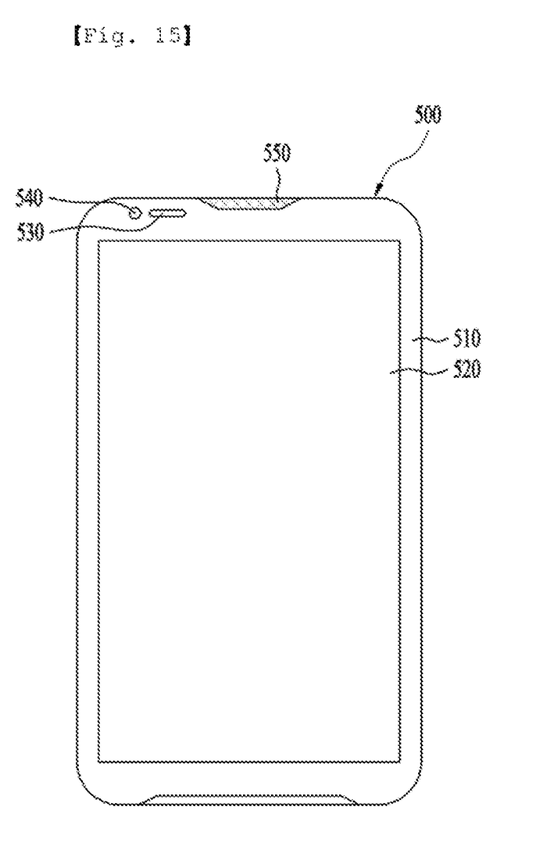
FIG. 15 is a view illustrating a mobile terminal in which the light-emitting element package is disposed.

FIG. 15 is a view illustrating a mobile terminal in which the light-emitting element package is disposed.

In the mobile terminal 500, a display 520 is disposed on a housing 510, and a cover 550 is disposed on the center portion of the upper end of the housing 510 to protect a sound output unit (not illustrated).

In addition, a camera module 530 and a light source 540 may be disposed close to the cover 550. The light source 540 may be the light-emitting element package or the light-emitting element module described above, and may be disposed on the front surface of the housing 510 as illustrated in FIG. 15, or may be disposed on the rear surface thereof.

Although embodiments have been described above, the above description is merely given by way of example and is not intended to limit the disclosure, and it will be apparent to those skilled in the art that various substitutions, modifications, and alterations may be devised within the spirit and scope of the embodiments. For example, the respective constituent elements described in the embodiments may be modified in various ways. In addition, differences associated with these modifications and alterations should be interpreted as being included in the scope of the disclosure defined by the accompanying claims.

INDUSTRIAL APPLICABILITY

A light-emitting element package and a light-emitting element module according to embodiments may increase illuminance in the direction orthogonal to the center of the emission surface thereof.

The invention claimed is:

1. A light-emitting element package comprising;
   a substrate;
   a light-emitting element disposed on the substrate;
   a phosphor layer disposed on the light-emitting element; and
   a molded part disposed to surround a side surface and an upper surface of the light-emitting element and having a pattern on a surface thereof from which light introduced from the light-emitting element is emitted,
   wherein the pattern is disposed on a first area corresponding to the light-emitting element and a portion of the pattern is disposed to correspond to a second area around the first area, and the pattern disposed on the second region is disposed within an angular range from 60 degrees to 65 degrees from an adjacent edge of an upper surface of the phosphor, wherein the angular range is based on a direction perpendicular to the upper surface of the phosphor, and
   wherein the pattern includes a plurality of protrusions, and protrusions disposed on the outermost side correspond to the first area and the second area.

2. The package according to claim 1, wherein the respective protrusions are spaced apart from one another by a predetermined distance.

3. The package according to claim 1, wherein the phosphor layer has a length in a first direction and a length in a second direction, and the length in the first direction is equal to or greater than the length in the second direction.

4. The package according to claim 2, wherein the protrusions have the same shape.

5. The package according to claim 4, wherein each of the protrusions has a height within a range from 5% to 25% of a length of the phosphor layer in a first direction.

6. The package according to claim 4, wherein each of the protrusions includes a cylindrical body.

7. The package according to claim 6; wherein each of the protrusions further includes an upper surface taking the form of a curved surface.

8. The package according to claim 7, wherein the curved surface has a radius of curvature of 5% or more of a length of the phosphor layer in a first direction.

9. The package according to claim 1, wherein the protrusions disposed on the outermost side vertically overlap the edge of the light-emitting element.

10. The package according to claim 1, wherein illuminance in an area orthogonal to a center of a surface of a phosphor layer is greater than illuminance in a direction oblique relative to the surface of the phosphor layer.

11. The package according to claim 1, wherein illuminance in a directions of 30 degrees from a surface of a phosphor layer is 87% or less of illuminance in an area orthogonal to a center of the surface of the phosphor layer.

12. A light-emitting element package comprising;
    a substrate;
    a light-emitting element disposed on the substrate;
    a phosphor layer disposed on the light-emitting element; and
    a molded part disposed to surround a side surface and an upper surface of the phosphor layer and the light-emitting element and having a pattern on a surface thereof from which light introduced from the light-emitting element is emitted,
    wherein the pattern includes a plurality of protrusions, and the protrusions have the same shape, and
    wherein the pattern is disposed on a first area corresponding to the light-emitting element and a portion of the pattern is disposed to correspond to a second area around the first area, and protrusions disposed on the outermost side are disposed to correspond both to the first area and to the second area.

13. The package according to claim 12, wherein the phosphor layer has a length in a first direction and a length in a second direction, and the length in the first direction is equal to or greater than the length in the second direction, and
    wherein each of the protrusions has a height within a range from 5% to 25% of the length of the phosphor layer in the first direction.

14. The package according to claim 13, wherein each of the protrusions includes a cylindrical body.

15. The package according to claim 14, wherein each of the protrusions further includes an upper surface taking the form of a curved surface.

16. The package according to claim 15, wherein the curved surface has a radius of curvature of 5% or more of the length of the phosphor layer in the first direction.

17. The package according to claim 12, wherein the protrusions disposed on the outermost side vertically overlap the edge of the light-emitting element.

18. The package according to claim 12, wherein illuminance in an area orthogonal to a center of a surface of the phosphor layer is greater than illuminance in a direction oblique relative to the surface of the phosphor layer.

19. The package according to claim 12, wherein illuminance in a direction of 30 degrees from a surface of the phosphor layer is 87% or less of illuminance in an area orthogonal to a center of the surface of the phosphor layer.

20. A light-emitting element module comprising:
    a light-emitting element package including a substrate, a light-emitting element disposed on the substrate, and a molded part disposed to surround a side surface and an upper surface of the light-emitting element and having a pattern on a surface thereof from which light introduced from the light-emitting element is emitted,
    wherein the pattern is disposed on a first area corresponding to the light-emitting element and a portion of the pattern is disposed to correspond to a second area around the first area, and the pattern disposed on the second region is disposed within an angular range from 60 degrees to 65 degrees from an adjacent edge of an upper surface of the phosphor; and a lens disposed on the molded part of the light-emitting element package.

\* \* \* \* \*